(12) United States Patent
Farooq et al.

(10) Patent No.: US 11,817,394 B2
(45) Date of Patent: Nov. 14, 2023

(54) SEMICONDUCTOR CIRCUIT POWER DELIVERY

(71) Applicant: International Business Machines Corporation, Armonk, NY (US)

(72) Inventors: Mukta Ghate Farooq, Hopewell Junction, NY (US); Katsuyuki Sakuma, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 61 days.

(21) Appl. No.: 17/498,472

(22) Filed: Oct. 11, 2021

(65) Prior Publication Data
US 2023/0113296 A1  Apr. 13, 2023

(51) Int. Cl.
| | |
|---|---|
| *H01L 23/48* | (2006.01) |
| *H01L 23/538* | (2006.01) |
| *H01L 21/48* | (2006.01) |
| *H01L 23/00* | (2006.01) |
| *H01L 25/16* | (2023.01) |
| *H01L 23/528* | (2006.01) |

(52) U.S. Cl.
CPC ...... *H01L 23/5386* (2013.01); *H01L 21/4853* (2013.01); *H01L 23/481* (2013.01); *H01L 24/16* (2013.01); *H01L 24/48* (2013.01); *H01L 25/16* (2013.01); *H01L 23/5286* (2013.01); *H01L 2224/16225* (2013.01); *H01L 2224/48229* (2013.01); *H01L 2924/16251* (2013.01)

(58) Field of Classification Search
CPC ........................ H01L 23/481; H01L 23/5286
See application file for complete search history.

(56) References Cited

U.S. PATENT DOCUMENTS

| | | |
|---|---|---|
| 9,379,074 B2 | 6/2016 | Uzoh et al. |
| 9,543,229 B2 | 1/2017 | Batra et al. |

(Continued)

*Primary Examiner* — Errol V Fernandes
(74) *Attorney, Agent, or Firm* — Daniel P. Morris; Lou Percello, Attorney, PLLC

(57) ABSTRACT

The present invention discloses embodiments of a semiconductor chip with one or more bottom external (power or ground) connections, a front side power network layer, a device layer, and a grind side power network layer. The device layer has a plurality of devices. One or more of the devices has one or more device power connections and one or more device ground connections and the device layer has a front side and a back grind side. The front side power network layer has power, ground, signal, and other connections that connect to respective device power and device ground connections from/through the top front side layer. In like manner, power, ground, signal, and other connections connect to respective device power and device ground connections from/through the bottom of grind side power network layer. (Alternative, e.g., external conduit connections are disclosed.) Accordingly, one or more first device power connections is connected to one or more of the front side power network layer connections, one or more second device power connections is connected to one or more of grind side power network connections so the front side power network layer and the grind side power network layer provide the device layer with a dual power/ground feed/distribution from both the top/back and bottom/front of the device layer of the chip.

20 Claims, 11 Drawing Sheets

(56) References Cited

U.S. PATENT DOCUMENTS

| | | |
|---|---|---|
| 9,870,979 B2 | 1/2018 | Batra et al. |
| 10,325,804 B2 | 6/2019 | Hellmund et al. |
| 10,636,739 B2 | 4/2020 | Beyne et al. |
| 10,679,941 B2 | 6/2020 | Zho et al. |
| 11,271,567 B1* | 3/2022 | Chen .................. H03K 19/1774 |
| 11,328,750 B1* | 5/2022 | Amirante .............. H01L 23/535 |
| 2012/0292777 A1 | 11/2012 | Lotz |
| 2020/0105671 A1 | 4/2020 | Lai et al. |
| 2020/0152508 A1 | 5/2020 | Jourdain et al. |
| 2020/0266169 A1* | 8/2020 | Kang ................ H01L 21/76877 |
| 2021/0118805 A1* | 4/2021 | Sio ...................... H01L 21/4857 |
| 2021/0143127 A1 | 5/2021 | Jain et al. |
| 2022/0045011 A1* | 2/2022 | Sio .......................... H01L 24/20 |
| 2022/0077109 A1* | 3/2022 | Chava ................ H01L 25/0652 |
| 2022/0077134 A1* | 3/2022 | Chen ...................... G06F 30/392 |
| 2022/0147679 A1* | 5/2022 | Edathil ................. G06F 30/394 |
| 2022/0223514 A1* | 7/2022 | Sisodia ................. H01L 27/092 |
| 2022/0262791 A1* | 8/2022 | Shi ........................ H01L 29/785 |
| 2022/0359369 A1* | 11/2022 | Tsai .................... H01L 23/3672 |

* cited by examiner

SEMICONDUCTOR CIRCUIT POWER DELIVERY

BACKGROUND

The present invention relates to powering semiconductor circuitry. More specifically, the invention relates to reliably and efficiently delivering power to semiconductor chip circuits and chip packages.

In the prior art, a customary way of delivering power and signal connections to semiconductor circuitry is through connections formed in the Back End of the Line (BEOL).

There are multiple metal conduction horizontal layers formed in the BEOL. Some of these horizontal layers contain horizontal connections that perform specific functions. For example, some horizontal connections distribute power to devices in the chip. Other horizontal connections can provide signals, information, data, and/or control to and from the devices. Generally, the horizontal connections are wires or connections that remain within the layers within a power distribution network, e.g., most horizontal connections are connections that run inside one or more of the horizontally layers inside a typical semiconductor circuit chip (chip).

Other connections formed in the BEOL are vertical connections, like vias. Vias, e.g., through silicon vias (TSVs), pass vertically through the horizontal connection layers to interconnect horizontal connections in different horizontal connection layers and/or to accomplish other vertical through connections.

Typically, external connections like C4 bonds or metallic pads are placed externally to the chip and are connected to/through the horizontal and/or vertical connections formed in the BEOL. Accordingly, one or more electrical conduction paths are formed connecting device power and/or device signal connections of devices, within the chip, to external connections, external to the chip.

Typically, these devices reside in a device layer within the chip. Generally, the device layer is proximate to, but separate from, the BEOL conduction horizontal layers. Devices can include active devices such as transistors, e.g., Field Effect Transistors (FETs) or Bipolar Junction Transistors (BJTs), and/or passive components like resistors, etc. These devices are made in the Front End of the Line (FEOL).

The connections made in the BEOL are usually made on one side of the device layer, i.e., the BEOL metallization side or "front side" of the chip. The side of the device layer opposite the BEOL metallization side, or across device layer from the front side, is called the "grind side" or "back side" of the chip. Fabrication steps such as thinning, dicing, etc. are performed on the grind/back side so as not to interfere with the metallization on the BEOL metallization side/front side of the chip.

In the front/BEOL metallization side, the layer thickness, connection size, and connection pitch can vary depending on the purpose of the connection.

For example, in some designs, a layer primarily containing signal, information, or/or control interconnections will have finer interconnections with a lower pitch (being more densely packed) and will be at a lower level in the structure to be closer to devices in devices layers. Due to low levels of signal/data/control current, these signal interconnections can be finer without incurring large resistive operating losses.

Thicker/larger connections distribute power and generally are placed in upper-level layers of the BEOL metallization side/front side, i.e., further away from the device layer. These power connections are larger to reduce the power losses that can occur at the higher current loads. These power distribution layers have power interconnections with a lower density because the power interconnections are larger in cross section and/or thicker.

In other words, lower-level interconnects (closer to the device layer) usually are finer and occur at a high density to connect the devices for signal/data/information/control functions. These thinner lines and vias have tighter pitches and are mostly used for the so-called "local interconnects".

In the upper levels (in the BEOL further away from the device layer), power connections can travel longer distances and carry higher currents. Generally, larger power connections are contained in these upper layers and larger connection size reduces $I^2R$ losses caused by the higher currents. Reducing power loss is more important for these larger connections than packing density. Therefore, these upper levels are thicker and have larger interconnect pitches. (These larger interconnects are so-called "global interconnects".)

However, note that in some embodiments, one or more "buried power rails (BPRs)", or power connections, are placed close to or within the device layer rather than being located at upper levels away from the device layer. This local placement provides a power source/connection close to the device layer.

To summarize, external power is connected to external chip connections, e.g., C4 connections and/or metallic/conductive pads. The power passes through the "front-side" of the chip (or BEOL metallization or BEOL power network) and distributes to the devices in the device layer. In like manner, signal, data, information, and control connections can be made from external chip connections, through the BEOL power network, to device signal/data/information/control connections.

However, problems exist with this type of power distribution in semiconductor chips. These problems compound as devices decrease in size and become more densely packed with connections and other circuitry.

For example, large power connections take up large amounts of space in the front side (BEOL metallization side) of the chip. This space is increasing needed for signal, information, data, and/or control connections, typically referred to as "signal connections". Additionally, constraints are placed on the routing of the power connections due to the dense device packing and the densely packed local interconnects near the devices. These constraints limit the routing of the power connections (and sometimes limit the routing of signal, data, information, and control connections) and result in less than efficient, e.g., longer, routing with additional associated power losses, e.g., $I^2R$ losses, and wiring complexity.

Accordingly, there is a need for more efficient power connection and/or power connection routing (and signal connection routing) within semiconductor chips (chips). For example, more efficient power connections within chips will reduce power losses and decrease chip heating resulting in more reliable chip performance and extended chip lifetime.

SUMMARY

The present invention discloses embodiments of a semiconductor chip (chip) with one or more bottom external (power or ground) connections and a front side power network layer with one or more front side layers. One or more of the front side layers has one or more front side power connections and one or more front side ground connections. One or more of the front side power connections are connected to one or more of the respective bottom external power connections. One or more of the front side ground connections are connected to one or more of the bottom external ground connections.

The chip has at least one device layer. The device layer has a plurality of devices. One or more of the devices has one or more device power connections and one or more device ground connections. The device layer has a device layer front side and a device layer back grind side.

The device layer front side of the device layer is above and attached to a top front side layer so that one or more of the front side power connections electrically connects to one or more of the device power connections and one or more of the front side ground connections connects to one or more of the device ground connections.

A grind side power network layer has one or more grind side layers. A bottom grind side layer is above and attached to the back grind side of the device layer so that one or more grind side power connections electrically connects to one or more of the device power connections and one or more of the grind side ground connections electrically connects to one or more of the device ground connections. Conduction paths are formed from the device power/ground connections, through the grind side power network layer, and to top external power and ground connections, respectively, on the top of the chip.

Accordingly, one or more of the device power connections is connected to one of the bottom external power connections, one or more of the device power connections are connected to one of the top external power connections, one or more of the device ground connections is connected to at least one of the bottom external ground connections and at least one of the top external ground connections. This provides the device layer with a dual power/ground feed/distribution from both the top/back and bottom/front of the device layer of the chip. In some embodiments, signal connections (device signal, information, data, and/or control connections) can also be routed from the devices through both the front side power network layer and the grind side power network layer to respective bottom external and top external signal connections of the chip.

Alternative embodiments with various external conduits are disclosed along with methods of making different chip embodiments and modules of one or more chips.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
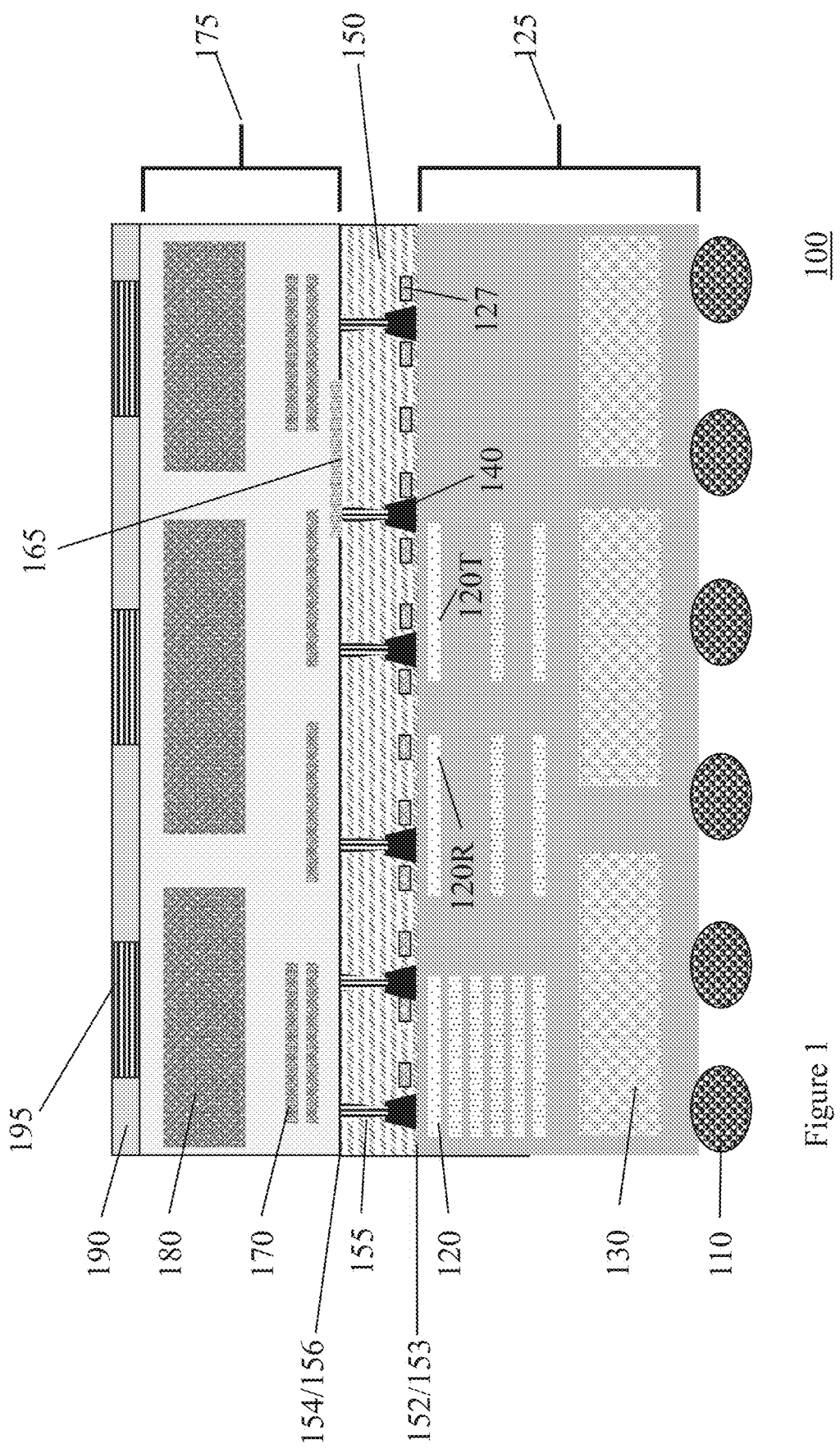
FIG. 1 is a block diagram of a semiconductor chip (chip) with a front side power/ground distribution network, a device layer, and a grind side power/ground distribution network, i.e., a device layer with dual power/ground/signal feed/distribution from both the top/back and bottom/front of the device layer of the chip.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements (like devices or components) may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in diverse applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings or the positioning of a first element to a side of a second element.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Disclosed are efficient and reliable semiconductor structures and circuitry, semiconductor chips (chips), and chip modules for distributing power/grounding/signals within and/or externally to/from one or more chips.

Embodiments of the invention distribute power within and external to/from the chip from two directions, that is to/from both: 1. a bottom power source from the front side of the chip through the traditional BEOL or front side power distribution network and 2. a top power source from the back side or grind side of the chip, through a new grind side power distribution network. Distribution of ground connections through both the front side power distribution network and the grind side power distribution network are also enabled as are signal connections in some embodiments.

The grind side power distribution network enables more power/ground connection points to the device layer; more efficient power/ground interconnection routing (through the grind side) to the device layer; reduction of power distribution $I^2R$ losses; and more, freed-up space, e.g., for additional connections, in the traditional BEOL metallization layers on the front side of the chip.

This dual power feed/distribution technology (power/ground distribution through both the front side power distribution network and the grind side power distribution network) also provides efficiencies in connecting certain technologies using devices like Complementary Field Effect Transistors (CFETs). When nFETs and pFETs are connected, wiring can be more efficiently accomplished when connections can be made on two sides (bottom and top) of these devices and/or by connecting power from one chip side (top or bottom) and exiting another chip side (bottom or top).

In addition, power distribution reliability can be increased by connecting power from two external sources, e.g., from both chip top external power connections and chip bottom external power connections by connecting one or more power connections in the front side power distribution network with one or more power connections in the grind side power distribution network. This can be accomplished by using a power vias and/or other connections, like one or more external power distribution conduits, conductive pillars, or posts.

Methods of manufacturing are disclosed to enable construction of the grind side distribution network and dual power/ground/signal connections to the chip.

FIG. 1 is a block diagram of a semiconductor chip (chip) embodiment 100 with a front side power/ground distribution network 125, a device layer 150, and a grind side power/ground distribution network 175, i.e., a device layer 150 with dual power/ground feed/distribution 125/175 from both the top/back 154 and bottom/front 152 sides of the device layer 150 of the chip 100.

The chip 100 has one or more bottom external connections 110. In some embodiments, the bottom external connections 110 are C4 connections and/or metal pad (not shown). Some of the one or more bottom external connections 110 connect to power feeds and/or power distribution connections in the front side power/ground distribution network 125. These bottom external connections are also referred to as bottom external power connections 110. Other of the one or more of the bottom external connections 110 connect to external ground connections and/or grounding connections within the front side power/ground distribution network 125. These bottom external connections are referred to as bottom external ground connections. In some embodiments, one or more of the bottom external connections 110 can be used as signal connections that pass through the front side power/ground distribution network 125 to connect to device signal connections.

The front side power network layer 125 has one or more front side layers. Some of front side layers contain one or more front side power connections 130. Generally, these front side power connections 130 run in a horizontal direction through the front side power network layer 125. The front side power connections 130 can run at different elevations within the front side power network layer 125. For example, the thicker/larger power distribution connections 130 distribute power and generally are placed in upper-level layers of the front side power network layer 125, i.e., further away from the device layer 150. On the other hand, the finer front side connections 120, normally used for signal, control, and/or data transmission, are typically found at lower levels in the front side power network layer 125 that are closer to the device layer 150.

In similar manner, ground connections 120/130 can run at different elevations, horizontally within the front side power network layer 125. Some of the front side ground connections 120/130 connect to common/ground connections in the device layer 150 and/or to bottom external ground connections 110.

One or more of the horizontal layers 120T of the front side power network layer 125 is the top layer 120T or near the top layer 120T of the front side power network 125. This top front side layer 120T easily interfaces with the bottom surface 152 of the active layer 150.

Some embodiments of the front side power network layer 125 have rails 120R. Rails 120R are power connections 120R in the front side power network layer 125 that distribute power to the device layer 150 but rather than being at the upper levels, the rail 120R connection is located at the lower-level layers of the front side power network layer 125, closer to (or even within) the active layer 150. A "buried power rail" contained in the layer 150 can also derive power from vias (e.g., device vias) 155.

In some embodiments, the front side power network layer 125 has one or more redistribution layers (RDLs). A RDL is an extra metal layer that makes some of the external connections 110 easier to access and/or connect to.

The front side power network layer 125 also has vias (not shown) that run in a vertical direction making connections between the horizontal layers and other connections as necessary.

Note that in FIG. 1, the power and ground connections are shown with the same reference numbers 120/120R/120T/130 and the power and ground external connections to which they may connection, e.g., C4 connections 110, are shown as the same reference numbers without loss of generality. In some embodiments, signal connections are also designated with the same reference numbers as well. One skilled in the art given this disclosure would know how to electrically separate power side connections from ground side connections (and signal connections) using standard practices.

The device layer 150 has a plurality of devices 140 (with device via connections 155) or 127, typically 140. In some embodiments, the devices 140 are on the bottom surface 152 of the device layer 150. Device vias 155 are used to connect device signal and device ground connections through the device layer 150 to the top surface and back/grind side 154 of the device layer 150.

One or more of the devices 140 may have one or more device power connections, device signal connections, device ground connections, etc. Non-limiting examples of devices 140 include active and passive components. Non-limiting examples of active components include transistors, field effect transistors (FETs), bipolar junction transistors (BJTs), diodes, energy sources, batteries, sensors, etc. Typically, active devices 140 have one or more device power and device ground connections (not shown, but well known). Non-limiting examples of passive devices 140 include resistors, capacitors, and inductors.

The device layer has a device layer front side 152 and a device layer back/grind side 154. The device layer front side 152 is above and is attached to the top surface 153 of the front side power network layer 125. One or more of the front side power network layer power connections 120/120R/120T/130 are electrically connected to one or more of the device 140 power connections (not shown) and one or more of the front side power network layer ground 120/120R/120T/130 connections are electrically connected to one or more of the device ground connections. In some embodiments, device signal connections are also connected to front side signal connections in the front side power network layer 125.

A grind side power network layer 175 has a grind side power network layer 175 bottom surface 156 that is positioned above and is attached to the back/grind side 154 of the device layer 150. Accordingly, the grind side power network layer 175 is on/attached to back/grind side 154 of the device layer 150 across/opposite the front side 153 of the device layer 150 to which the front side power network layer 125 is attached.

The grind side power network layer 175 has one or more grind side layers 170/180/165 including a bottom-most/bottom grind side layer 165. The bottom grind side layer 165 is above and attached to the back/grind side 154 of the device layer 150.

One or more of the grind side layers 165/170/180 has one or more grind side power connections, e.g. 165/170/180. As before, one or more of these grind side layers, e.g., connections 165/170/180 serves as a common/ground connection (or signal connection) depending on how the connection is wired. One or more of the grind side power connections is electrical connected to one or more of the device power connections and one or more of the grind side ground connections is connected to one or more of the device ground connections. Device signal connections are made in some embodiments.

The grind side power network layer 175 has one or more top external connections 195. One or more of these top external connections 195 can be used as a top external power connection 195. In similar manner, one or more of the top external connections 195 can be used as a top external ground (signal) connection 195. The designation of the top external connection 195 conforms to the type of connection that is made without loss of generality.

One or more of the top external power connections 195 is connected to one or more of the grind side power connections/layers 165/170/180 and/or device 140 power connections. One or more of the top external ground connections 195 is connected to one or more of the grind side ground connections 165/170/180 and/or device 140 ground/common connections.

Accordingly, one or more of the device 140 power connections is/can be connected to at least one of the bottom external power connections 110, at least one of the top external power connections 195, or to both one or more of the bottom external power connections 110 and one or more of the top external power connections 195. One or more of the device ground connections can be connected to one or more of the bottom external ground connections 110, one or more of the top external ground connections 195, or to both one or more of the bottom external ground connections and one or more of the top external ground connections.

Note that in some embodiments, the top external power/ground connections 195 are electrically insulated from one another by an insulating material 190, e.g., by being imbedded in and/or surrounded by an insulating material making up the top external connection layer 190. This insulating material 190 can be a polymer, dielectric, or other electrically insulating material. In some embodiments the insulating material 190 is thermally conductive. In some embodiments, the insulating material 190 is a dielectric like silicon nitride (SiN), silicon dioxide (SiO2), or silicon carbon nitride (SiCN), deposited by known methods.

As described below, in some embodiments, additional layers are attached to the top external connection layer 190.

Having power/ground connections from both the front side power network layer 125 and the grind side power network layer 175 enables more efficient routing and connections of power and/or ground connections to and/or from the respective device power and ground connections; shorter connections; reduced $I^2R$ losses; and more connection room.

Note that vertical connections in the device layer 150 are made with device vias 155. Vias (not shown) also can make vertical connections, e.g., between horizontal layers 120/120R/120T/165/170/180 in the front side power network layer 125 and the grind side power network layer 175, respectively.

Also note that in some embodiments, signal, control, and data connections can pass through the front side power network layer 125 and/or the grind side power network layer 175 to connect with like connections on the devices and/or external connections 110/195.

Figure 2:
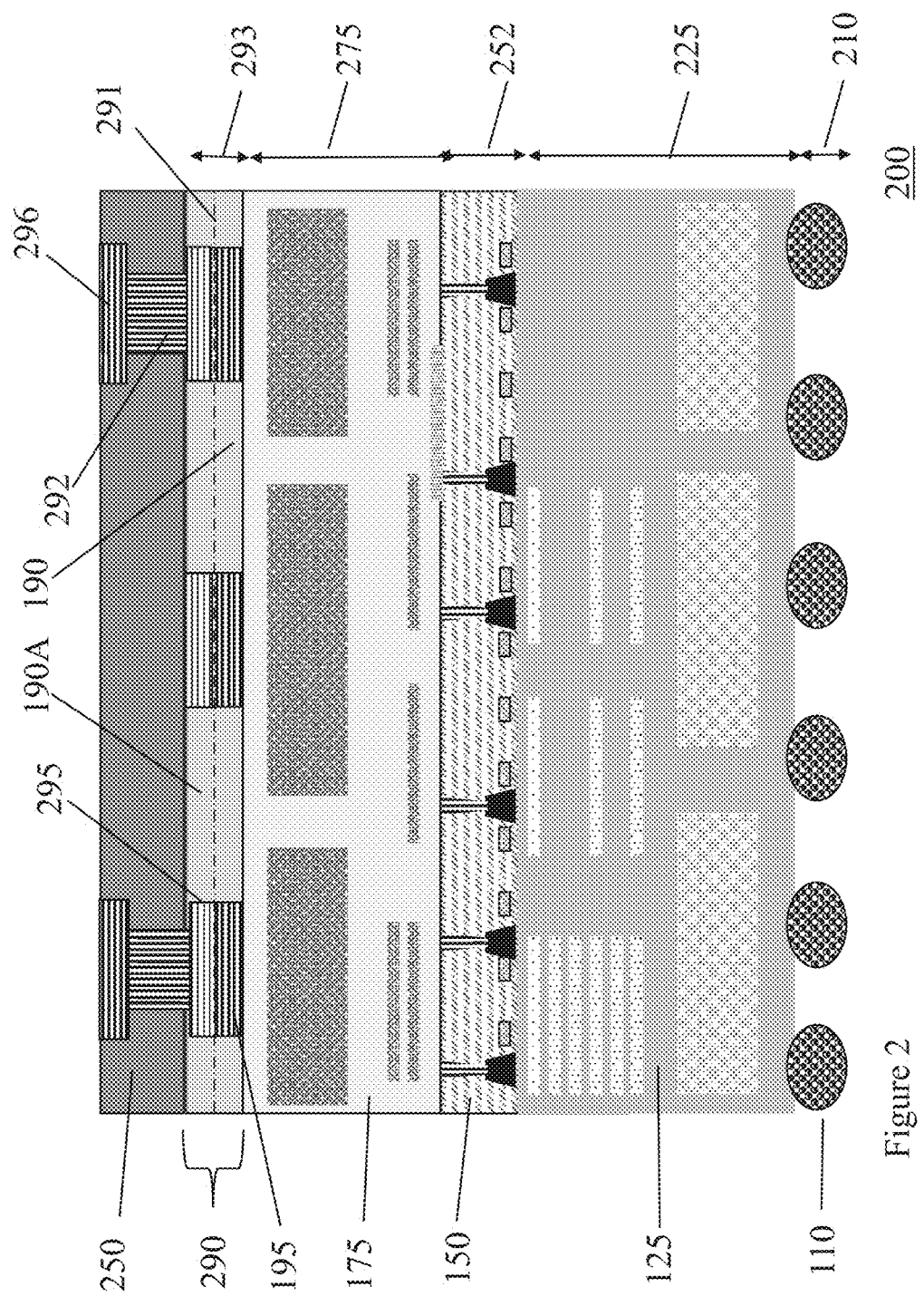
FIG. 2 is a block diagram of the chip with a dual front side and grind side power/ground/signal distribution network with a semiconductor input power layer containing power through-silicon vias (PTSVs).

FIG. 2 is a block diagram of an embodiment of the chip 200 with a dual front side 125 and grind side 175 power/ground distribution network 125/175 with a semiconductor input power layer 250 containing one or more power through-silicon vias (PTSVs) 292.

In some embodiments, the semiconductor input power layer 250 is made with one or more power vias 292 and one or more power via top conductive caps or pads 296 along with pads 295. Layer 190A is a "mirror image" of layer 190 in that the conductive parts, e.g., pads 195 and 295, are positioned opposite one another and are made of compatible conductive material, e.g., copper. In addition, the dielectric (or electrically insulating portions of layers 190 and 190A), are made of compatible materials likewise positioned opposite one another. (By positioned opposite one another is meant that the combination 290 of layers 190 and 190A are placed facing one another along interface 291 and layers 190 and 190A are bonded together, e.g., hybrid bonded, to form layer 290 with fused and electrically continuous pads 195 and 295 electrically separated by a continuously and bonded electrically insulator material 190/190A.)

This chip embodiment 200 shows dimensions of the various layers. For example, the front side power/ground distribution network 125 has a front side thickness 225 between 3 micrometers (μm) and 5 μm. The active region 150 has an active region thickness 252 between 0.3 μm and 1 μm or around 0.5 μm. The grind side power/ground distribution network 175 has a grind side thickness 275 between 3 μm and 5 μm and the top external connection layer 290 has a top external connection layer thickness 293 between 1 μm and 3 μm, typically 2 μm. The bottom external connection thickness 210 of the bottom external connections 110 is between 40 μm and 100 μm. The semiconductor input power layer 250 thickness is between 50 μm and 400 μm.

The semiconductor input power layer 250 is made of a non-electrically conductive material. In some embodiments, the semiconductor input power layer 250 is also thermally conductive. In some embodiments, the semiconductor input power layer 250 can be polymer or non-doped semiconductor material, e.g., silicon or amorphous silicon. Dielectric materials, as mentioned above, can also be used.

Power via conductive pads 295 are disposed on the top external connections 195 and electrically connect a bottom portion of the power via 292 to the top external connections 195. A power via top conductive cap or pad 296 electrically connects to a top portion of the power via 292. The power vias 292 enable delivery of power from source external to the chip 100/200 to the grind side power/ground distribution network 175 and to the conductive layers 165/170/180 within the grind side power/ground distribution network 175.

The power vias 292, power via conductive pads 295, and power via top conductive caps/pads 296 are made of conductive materials, typically metals like copper.

Figure 3:
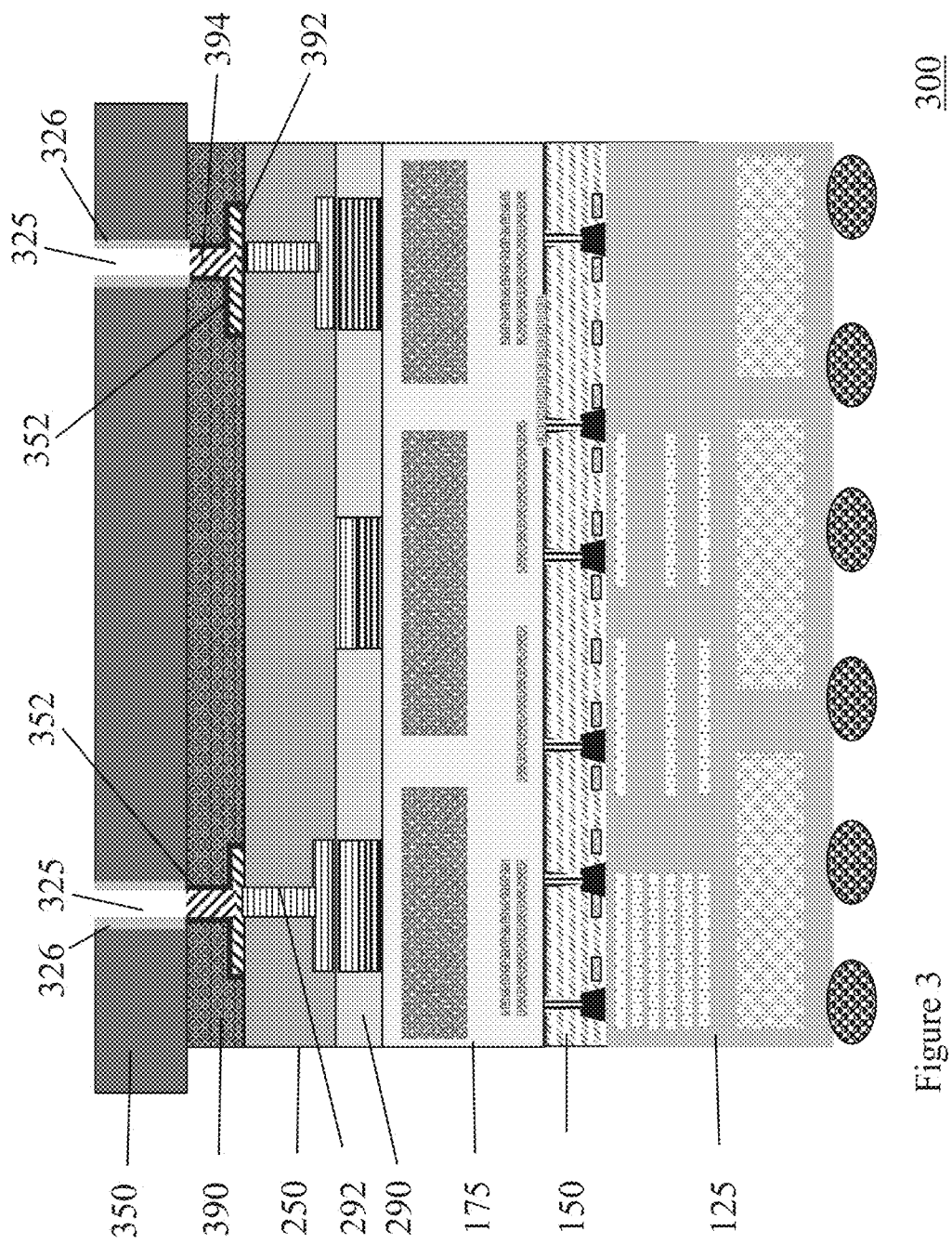
FIG. 3 is a block diagram of the chip with a dual front side and grind side power/ground/signal distribution network with a semiconductor input power layer containing power through-silicon vias (PTSVs), a lid, and a heat sink.

FIG. 3 is a block diagram of a chip embodiment 300 with a dual front side 125 and grind side 175 power/ground distribution network 125/175 with a semiconductor input power layer 250 containing through-silicon power vias (TSPVs) 292, a lid 390, and a heat sink 350.

The lid 390 is made from a thermally conductive material, like copper or aluminum, and acts as a sealing layer that structurally contains the internal components of the chip 300 and seals external contaminants from the chip 300 internal components. The lid 390 also conducts heat from the chip 300 internal components, e.g., from the devices 140 through the semiconductor input power layer 250 and to the ambient environment, e.g., through a heat sink 350.

In some embodiments, there are sealed penetrations through the lid 390 that enable continuity of electrical contact from the chip 300 internal devices 140 and external signal, ground, and/or power connections. For example, one or more lid conductive pads 392 at the bottom surface of the lid are positioned to electrically connect to the top portions of the power vias 292 and/or the power via top conductive cap or pad 296. In some embodiments, lid vias 394 electrically connect to the lid conductive pads 392 and pass through the lid 390. Due to the electrically conductive nature of some embodiments of the lid 390, the lid conductive pads 392 and the lid vias 394 are electrically insulated 352 from the lid 390 material, i.e., with a dielectric or insulating sleeve 352 between the lid 390 and the lid vias 394 and lid conductive pads 392.

The electrically insulating properties of the semiconductor input power layer 250 and the top external connection layer 290 also electrically insulate the lid 390 from the grind side power/ground distribution network 175 while maintaining electrical conductivity through the lid vias 394 and lid conductive pads 392. In some embodiments, the lid 390 is attached to the semiconductor input power layer 250 with a thermal interface material (TIM).

A heatsink 350 is thermally and mechanically attached to the surface of the lid by known methods, e.g., a TIM, like thermal greases. In some embodiments, apertures 325 are formed through the heatsink 350 to permit external wiring/connections to connect external circuitry through the heatsink 350 to the lid vias 394 and other conductive pathways described to complete power, ground, signal, control, and/or data connections continuously to the devices 140. The heatsink 350 apertures are insulated 326 with dielectric or other electrically insulating sleeves 326 to prevent the external wiring/connections from electrically shorting to the heatsink 350. Other connections enabling electrical conductivity/connections to the devices 140 through the heatsink 350 are envisioned.

Figure 4:
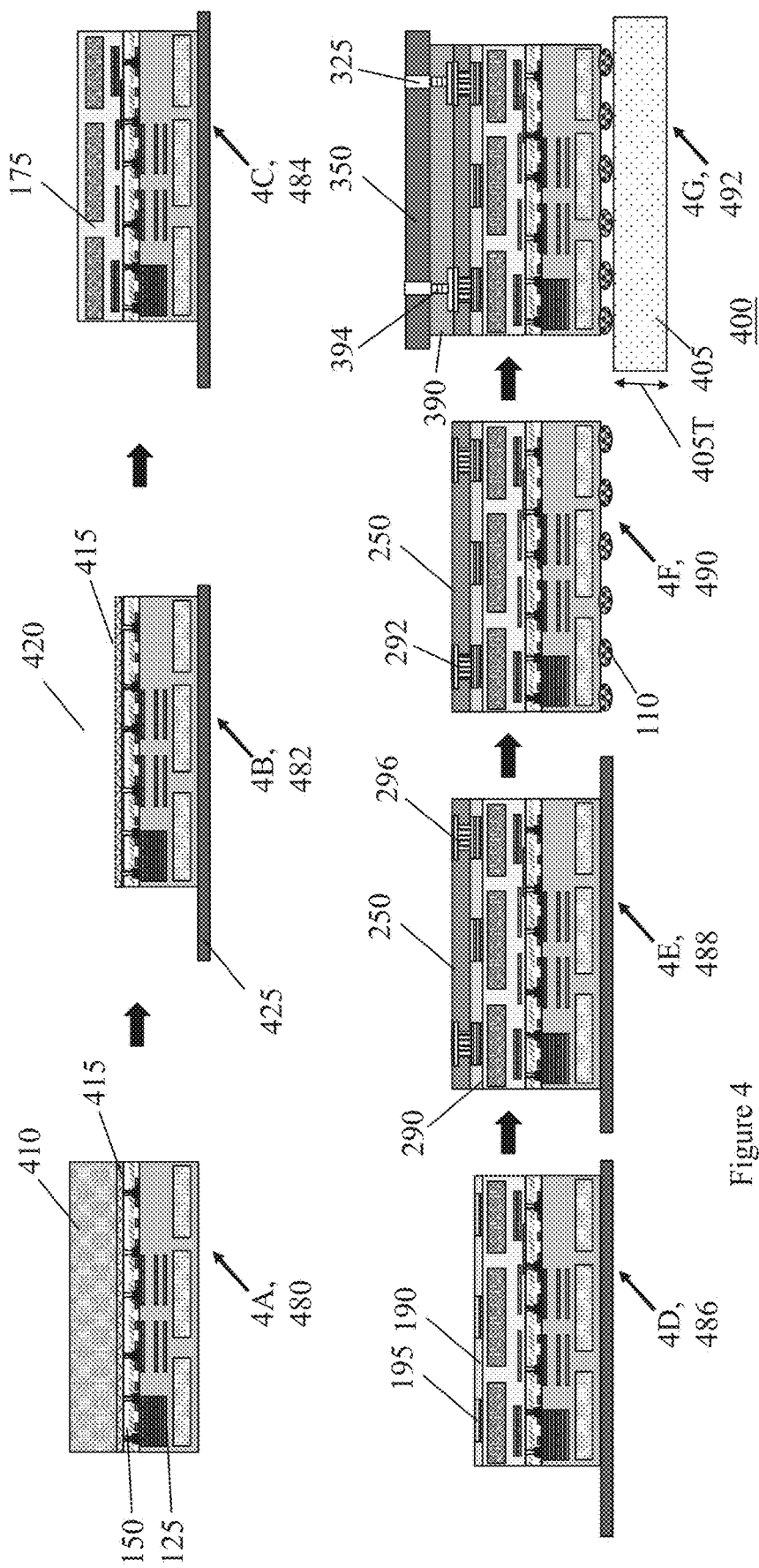
FIG. 4 is a chart showing steps of a process of making a chip with a front side and grind side power/ground distribution network along with block diagrams of structures made during steps of the process.

FIG. 4 is a chart showing steps of a process 400 of making a chip, typically 100, and/or chip embodiments 100/200/300 with a front side 125 and grind side 175 power/ground distribution network 125/175. Block diagrams are shown of structures (structures/steps 4A, 4B, 4C, 4D, 4E, 4F, and 4G) made at steps during the process 400.

In some embodiments, the process 400 begins at step 480 with structure 4A. Structure 4A has a front side power/ground distribution network 125, e.g., created by BEOL processes, and with a device layer 150 attached to and above the front side power/ground distribution network 125. These structures are known in the art. Often these structures 125/150 are made on a semiconductor substrate like a silicon wafer or substrate 410. An etch stop layer 415, such as a layer of oxide or nitride can be placed between the wafer/substrate 410 and the device layer 150 by known processes, e.g., FEOL and BEOL processes.

At step 482, the wafer/substrate 410 is removed 420, e.g., by a chemical-mechanical polishing (CMP), exposing the etch stop layer 415 in structure 4B.

The build of the grind side power/ground distribution network 175 is facilitated by using a handler 425. The structure 4B is attached to the handler 425. The handler 425 is typically a thick, strong, and rigid substrate 425, e.g., glass or silicon, that provides support, structure, stiffness, and mobility for the structure 4B through some of the stages/steps (4C, 4D, and 4E) of the process 400.

At step 484, after removing the etch stop layer 415, the grind side power/ground distribution network 175 is built upon the device layer 150. Conductive layers 165/170/180, top external connections 195, vias, and other layers and components are created in the grind side power/ground distribution network 175 using the same materials and methods used to create the front side power/ground distribution network 175. However, the sizing, direction, location, etc. of these conductive layers 165/170/180 and external contacts is dictated by design constraints on the grind side power/ground distribution network 175.

For example, in some embodiments, the devices 140 remain on the device layer front side 152 and connections are made to the back/grind side 154 of the device layer 150 through the device vias 155.

In some embodiments, the etch stop layer 415 is removed by a chemical process, e.g., a reactive ion etch (RIE) with a chemistry that selectively removes the material in the etch stop layer 415. Removal of the etch stop layer 415 exposes the device power and ground connections, e.g., through-silicon vias TSVs (including nanoTSVs, nTSVs, and/or associated pad/connections, or nanopads that have thicknesses of between 50-100 nanometers (nm)).

At step 486, using known methods, the top external connection layer 190, along with the top external connections 195 and dielectric insulating material 190, are formed on the grind side power/ground distribution network 175 to form structure 4D.

At step 488, as described above, structure 4E is created by forming/placing the semiconductor input power layer 250 and the top external connection layer 290 along with the power through-silicon vias (PTSVs) 292 and the power via top conductive cap or pad 296. A planarization or CMP is performed to level the surface. Known bonding techniques, e.g., hybrid bonding, are performed to insure correct and continuous conductivity to and from the external device connections 296 and with the top external connections 195.

At step 490, structure 4F is strong enough to be handled without the handler 425, so the handler 425 is removed. The handler 425 is removed by reversing the attachment method, e.g., chemically dissolving the adhesive used for attaching the handler. It is noted that a temporary handler (not shown) may be attached to the top surface of layer 250 if the structure is not strong enough to withstand attachment of the external connections 110.

Typically, after the handler 425 is removed, the bottom external connections 110 are formed using known techniques. Examples of external connections 110 include C4 connections and/or metal pads (not shown).

At step 492, typically after formation of the bottom external connections 110, the structure 490 is attached to the substrate 405, e.g., by positioning the structure 490 on the substrate 405 and flowing the solder in the C4 connections and/or by other electromechanical connections to contacts (not shown) on the substrate 405. Accordingly, the bottom external connections 110 are physically and electrically attached to the substrate/laminate 405, e.g., through C4 bonding.

At step 492, the lid 390 is then typically attached to the top of the semiconductor input power layer 250, while lining up the lid conductive pads 392 and lid vias 394 with the power through-silicon vias (PTSVs) 292 to maintain electrical continuity with device connections in the grind side power/ground distribution network 175.

Further, at step 492, structure 4G is formed by attaching the heatsink 350 to the top surface of the lid 390 as described above. In embodiments where there are apertures 325, alignment of the heatsink 350 apertures 325 is required to provide a connection path to the lid vias 394 and/or the lid conductive pads 392.

It is noted that the lid 390 is shown in the figures as a flat layer/plate for simplicity. However, other instantiations of the lid 390 are envisioned. For example, throughout this disclosure, the lid 390 may be a top layer/plate with one or more "legs" that extend down from the top layer/plate to attached to and thermal connect to the substrate 405. These legs provide additional heat paths from the substrate 405 through to the top surface of the lid 390 and through the heat sink 350. In some embodiments, the legs (not shown) of the lid 390 may partially encompass or surround the structure 490. Lids 390 with legs, as described, are known.

The substrate 405 can have a substrate thickness 405T between 0.7 millimeters (mm) and 2 mm. The substrate 405 provides external ground, power, signal, data, and/or control connections and routing to the chip 100/200/300. The substrate 405 provides the chip with a base mechanical support and provides connections to larger system components, e.g., panel backplanes, etc.

In some embodiments, the substrate 405 is a packaging substrate 405, like a laminate substrate 405 (also referred to as 405L, below). Laminate substrates 405 can be made of multiple materials like ceramic, plastic, or resin-based materials. Substrates can be either double-sided or multilayer and are well known in the semiconductor industry. Other substrates and substrate materials 405, e.g., semiconductor substrates 405S, are envisioned. For example, see substrates 405S described below.

Figure 5:
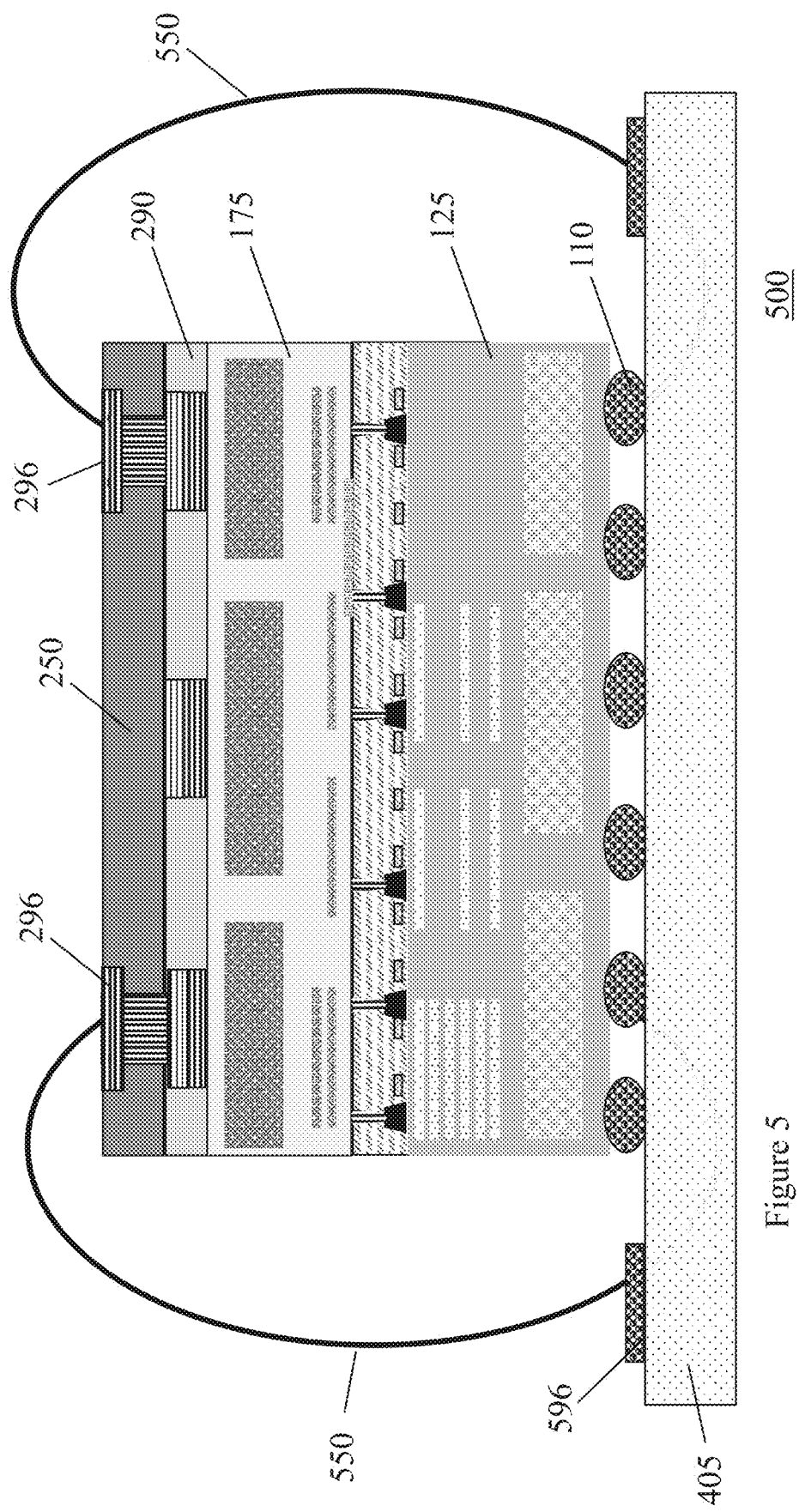
FIG. 5 is a block diagram of one embodiment of a chip with a front side and grind side power/ground/signal distribution network where external power is brought to the grind side power/ground distribution network through one or more wire bond connections from a substrate.

FIG. 5 is a block diagram of one embodiment of a chip 100/200 with a front side 125 and grind side 175 power/ground distribution network 125/175 where external power is brought to the grind side power/ground distribution network 175 through one or more wire bond connections 550. The wire bond connections 550 connect from one or more substrate power connections 596 on a substrate 405 to the power via top conductive cap or pad 296 or other top external connections 195. Since the size of the wire bond 550 can be relatively large, large amounts of current can be delivered from the substrate 405 to the grind side power/ ground distribution network 175 without going through the chip, e.g., 100. Wire bonding methods are well known.

Figure 6B:
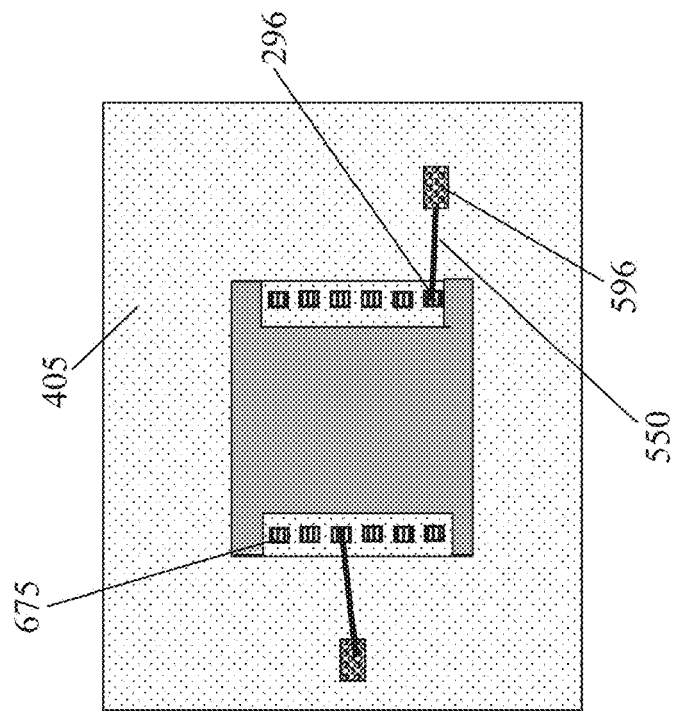
FIG. 6B is a top cross section view of the structure shown in FIG. 6A.
Figure 6A:
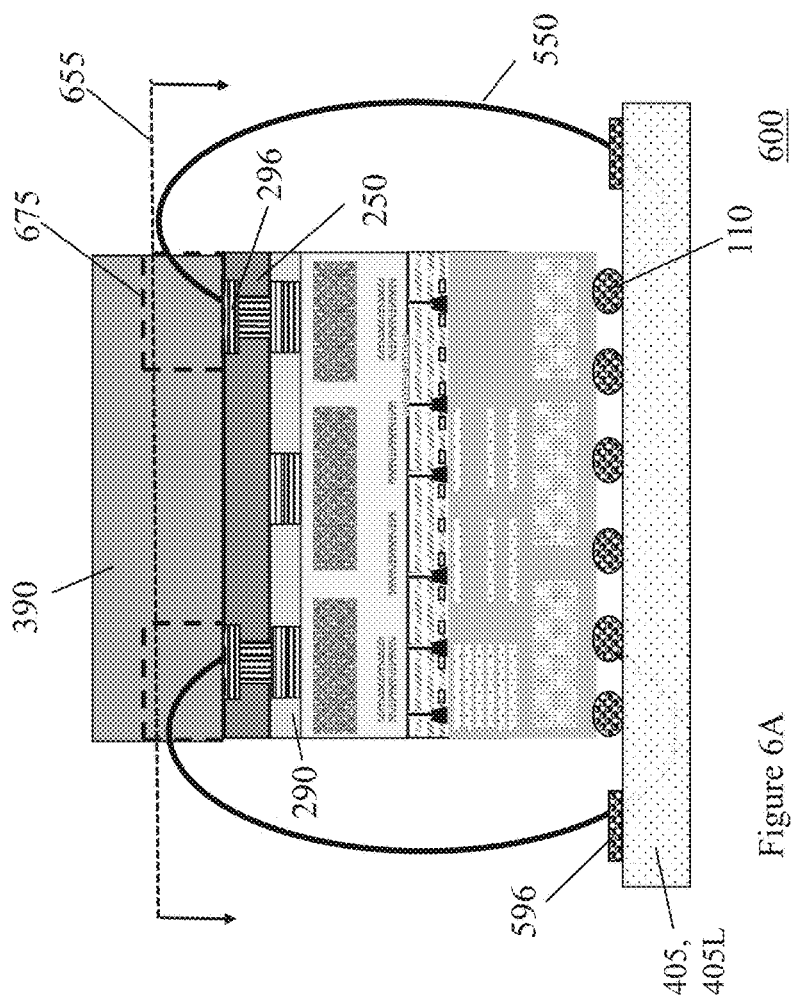
FIG. 6A is a cross section elevation view of an embodiment shown in FIG. 5 showing notches in the lid to accommodate the wire bond connections.

FIG. 6A is a cross section elevation view of the embodiment 500 shown in FIG. 5 including notches 675 (in phantom view) in the lid 390 to accommodate the wire bond connections 550. The notches 675 permit the wire bonds to attach to the power via top conductive cap or pad 296 either before or after the lid 390 is attached without the lid 390 interfering with the wire bond 550 attachment.

In FIGS. 5 and 6A, one preferred embodiment of the substrate 405 is an organic substrate 405/405L, described above.

FIG. 6B is a top cross section view 650 of the structure shown in FIG. 6A through the section 655. This view 650 shows the top of the power via top conductive cap or pads 296, the wire bonds 550, and the one or more substrate power connections 596.

Note that as mentioned above, the lid 390 shown in FIGS. 6A and 6B can have "legs."

Figure 7:
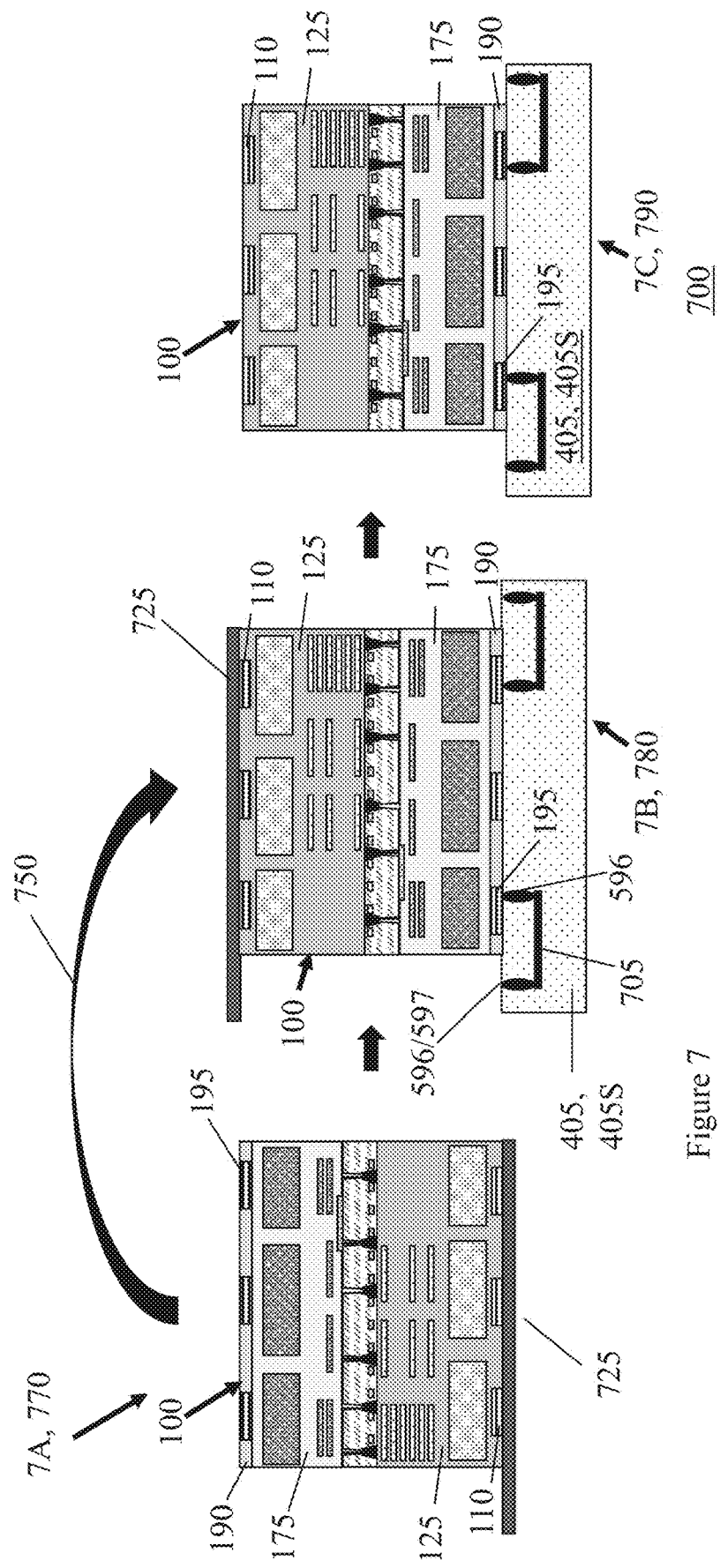
FIG. 7 is a chart showing steps of a process of making an embodiment of a chip with a front side and grind side power/ground/signal distribution network attached to a substrate along with block diagrams of structures made at steps of the process.

FIG. 7 is a chart showing steps of a process 700 of an embodiment of attaching a chip, e.g., 100, to a substrate 405/405S to form a module, e.g., structures 7B and 7C, along with block diagrams of structures (7A, 7B, 7C) at different steps of the process. The chip 100 has a front side 125 and grind side 175 power/ground distribution network 125/175.

The process 700 begins with step 770 by creating structure 7A where one or more embodiments of the chip, e.g., 100, 200, 300, etc. are attached to a handler or carrier 725. Carriers 725 and attaching carriers 725 to chips are known. Note that the bottom external connections 110 are shown as metal pad 110 embodiments. In some embodiments, the carrier 725 is attached to the front side 125 of the chip 100.

To form structure 7B, step 780 of the process 700 flips, positions, and places 750 the chip 100 on a (first) substrate 405/405S where the top external connections 195 are electrically connected to associated substrate connections 596 on a substrate 405/405S, where the substrate connections 596 are below the chip 100. Note that in preferred embodiments, the carrier 725 is used to "flip" or rotate the chip, so that the top external connections 195 are the connections aligned with and electrically connected to the substrate connections 596.

Note that a preferred substrate 405/405S in this embodiment is a (first) substrate 405S made of a semiconductor material, e.g., silicon.

In some embodiments, there are one or more substrate connections 705 internal to the (first) substrate 405/405S. Some of these internal substrate connections 705 connect substrate connections 596 below the chip 100 to one or more substrate connections 596/597 that are accessible on the substrate 405/405S and are substrate connections 596/597 outside from under 597 the chip. Note that in some embodiments, the substrate power connections 596/597 and internal substrate connections 705 can be used to connect ground, signal, control, and/or data connections.

Step 790 forms structure 7C by removing the handler or carrier 725 using known techniques as discussed above. Structure 7C has one or more of the chips, typically 100, with one or more top external connections 195 connected to internal substrate connections 705 through substrate power connections 596 while exposing the bottom external connections 110 (now "flipped", facing upward, on top of the structure 790). One or more of these substrate power connections 596 is available for connection to other components on the surface of the substrate 405/405S since the substrate connections 596 under the chip 100 are connected by the internal substrate connections 705 to one or more substrate connections 596/597, not under the chip 100, that are accessible from the top of the (first) substrate 405/405S.

Figures 8A, 8B:
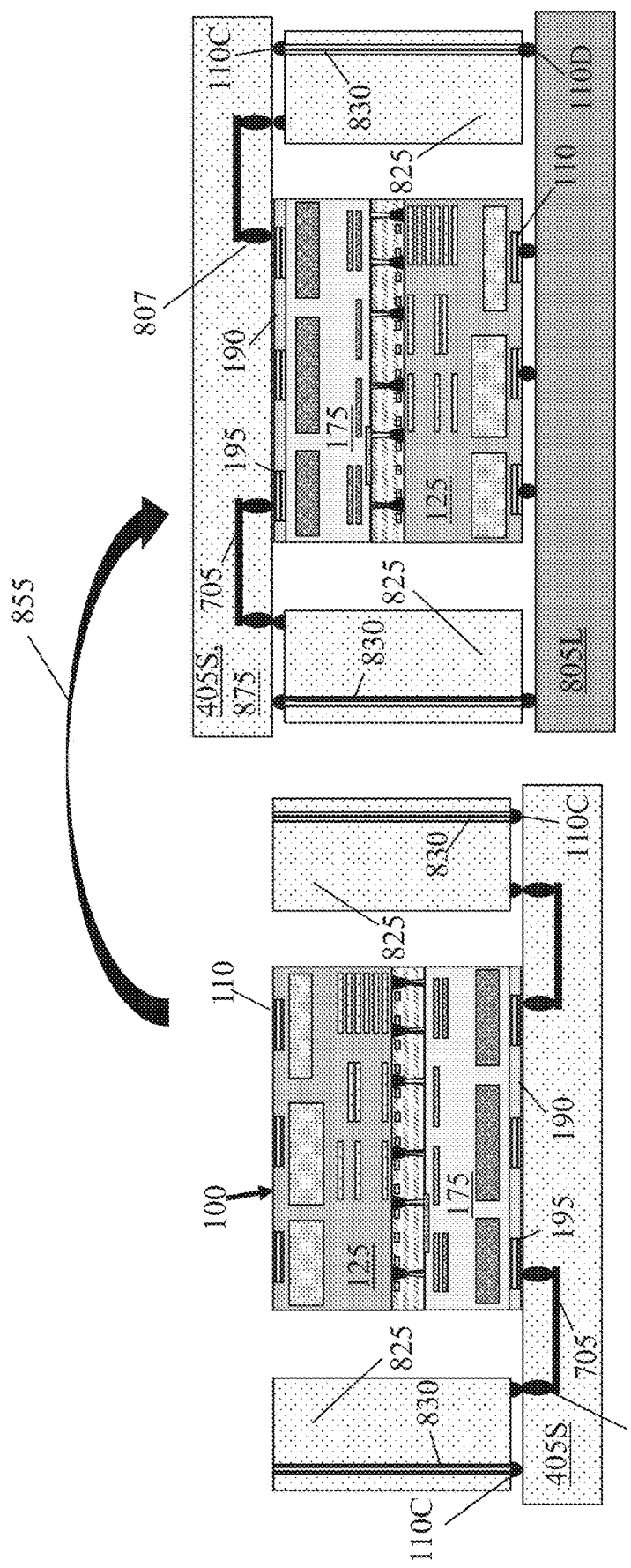
FIG. 8A is a chip module with a chip having a dual front side and grind side power/ground/signal distribution network attached to a first substrate (later to become a top external power distribution conduit) and with one or more vertical/side external power distribution conduits.
FIG. 8B is a chip module as in FIG. 8A with a chip having a dual front side and grind side power/ground/signal distribution network attached to a second substrate and with one or more vertical/side and a top external power distribution conduit(s).

FIG. 8A is a chip module 800 with a chip, typically 100, having a dual front side 125 and grind side 175 power/ ground distribution network 125/175, attached to a first substrate 405S, e.g., the (first) semiconductor substrate 405S, later to become a top external power distribution conduit(s) 875 bridge, along with one or more vertical/side external power distribution conduits 825. In this embodiment, the first semiconductor substrate 405S is as shown in FIG. 7C where the chip, typically 100, is in the "flipped/ rotated" orientation.

In some embodiments, the vertical/side external power distribution conduits 825 are made of non-conductive material, e.g., undoped semiconductor (silicon) or dielectric. The vertical/side conduits 825 have conduit connections 830 that are made of conductive material, e.g., metal, copper, etc. The vertical/side conduit connections 830 can run through the vertical/side conduit 825 vertically, e.g., from the top to the bottom of the vertical/side conduit connections 830. Conduit connections 110C, e.g., C4 and/or conductive/metal pads, can make external connections to the conduit connections 830.

Some embodiments of the vertical/side conduits 825 can have internal electrical interconnects and/or active or passive devices (not shown).

Embodiments of the vertical/side conduits 825 are electrically attached to the (first) substrate 405/405S on one or more sides of (or sometimes surrounding) the chip 100. Connections are made between the vertical/side conduits 825 conduit connections 830 (internal to conduit 825, not shown) and the substrate power connections 597, e.g., through the conduit connections, typically 110C. Accordingly, connections between the bottom and the top of the vertical/side conduits 825 are enabled for power, grounding, signal, control, and/or data between the bottom and top of the vertical/side conduits 825 and at/near the chip bottom 110 and top 195/295/296 external connections of the chip 100.

FIG. 8B is a chip module 850 as in FIG. 8A with a chip, typically 100, having a dual front side 125 and grind side 175 power/ground distribution network 125/175. The chip 100 is attached to a second substrate 805L, e.g., a laminate substrate 805L/405L, along with one or more vertical/side conduits 825. One or more top external power distribution conduit(s) 875 bridges (previously the first substrate 405S) provides connections over the chip 100. Note that the first substrate(s) 405S has become (one or more) top external power conduit bridges 875, and will be referred to as such.

To create the chip module 850 structure of FIG. 8B, the structure 800 is moved and flipped/rotated 855 so that the bottom external connections 110 (now flipped again to face down, i.e., face toward the second substrate 805L) and contacts 110D of the vertical/side conduits 825 opposite the first substrate 405S, are aligned and electrically connected to contacts on a second substrate 805L.

Accordingly, after this flip/rotation 855, the first substrate 405S becomes a top external power distribution conduit(s) 875/405S and a new, second substrate 805L (or substrate 805L) supports and attaches as the bottom (as shown in FIG. 8B) of the module 850.

As stated, the top external power distribution conduit(s) 875/405S can be made from similar materials as the vertical/ side conduits 825, e.g., a non-conductive semiconductor, a dielectric, or an insulator. The top external power distribution conduit(s) 875 also have top conduit internal connections 705 that connect two or more top conduit external connections 807. Again, the top conduit external connections 807 can connect to vertical/side conduit external connections 110C and/or other connections, e.g., the chip 100 top external connections 195/295/296.

According, the top power distribution conduits(s) 875 bridge over the chip 100/200 and, in combination with the vertical/side conduits 825, provide connections/interconnections between the front side 125, grind side 175 power/ground distribution networks 125/175, chip top external connections 195/295/296, and/or substrate power connections 597.

Therefore, chip module embodiments 800/850 embodiments, using vertical/side conduits 825 and top power distribution conduits(s) 875 can provide additional and/or redundant connections that are shorter, easier to route, and results in less power loss.

Figures 9A, 9B:
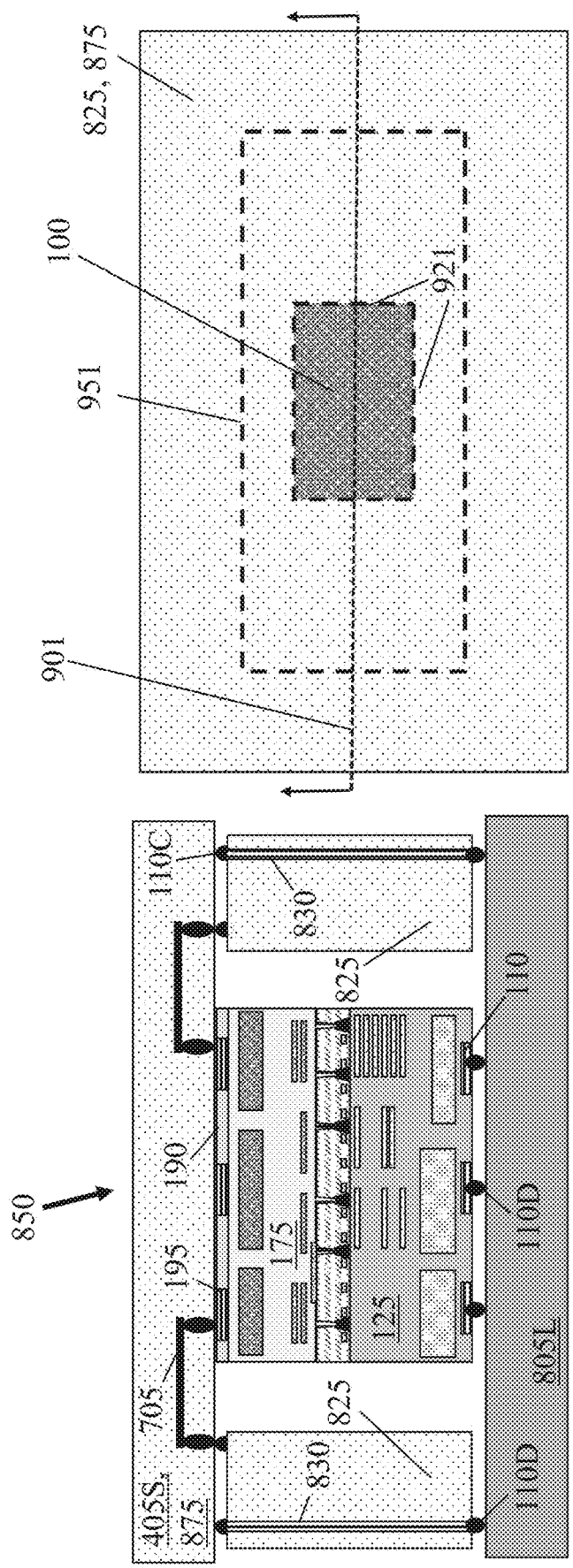
FIG. 9A is a cross section elevation view of a chip module with one or more vertical/side external power distribution conduits encompassing/surrounding one or more chips on three or more sides.
FIG. 9B is a top view of FIG. 9A.

FIG. 9A is a cross section elevation view of an embodiment 850 of a chip module 900, seen through cross section 901 (FIG. 9B), showing one or more vertical/side external power distribution conduits 825 encompassing or surrounding one or more chips 100/200 on three or more sides 921.

Chip module embodiments, e.g., 850, of one or more chips 100/200 are connected to and disposed on a substrate 805L as described above with two or more vertical/side conduits 825 around, on the sides 921 of, the chip 100/200, while bridged over by one or more top power distribution conduit(s) 875. The vertical/side conduits 825 and the top power distribution conduit(s) 875 are arranged such that the chip(s) 100/200 is/are partially or entirely encompassed (surrounded) by the conduits 825/875 resulting in a partially or totally enclosed module 900/950.

In alternative embodiments, the heatsink 350 and sometimes the lid 390 will be attached to the top surface of the top power distribution conduit 405S. The heatsink 350/lid 390 can be necessary if the chip, e.g., 100, generates large amounts of heat, as can happen when power is provided to both the top and bottom of the chip 100. While not shown, the heatsink 350/lid 390 can be attached, e.g., with a TIM, to the top surface of the top power distribution conduit 405S in FIGS. 8B, 9A, and 10.

FIG. 9B is a top view 950 of FIG. 9A. In the embodiment 950 shown, the top view of the chip 100/200 is shown in phantom view underneath (through) the top power distribution conduit(s) 875, for example, the chip sides, typically 921, of the chip 100/200 are shown in phantom. In this embodiment, a single top power distribution conduit 875 covers the entire module 900/950. Interior vertical conduit 825 sides 951 of the vertical/side conduits 825 are also shown in phantom.

As can be seen, the entire top surface of the top power distribution conduit 405S/875 is in view in FIG. 9B. In addition to the chip 100/200 being seen in phantom view, the sides 951 of the vertical/side conduits 825 are seen in phantom 951, as is the top surface of the vertical/side conduits 825. This embodiment shows that the vertical/side conduits 825 encompass the chip 100/200 on enough of the chip sides 921 so that the chip 100/200 is completely surrounded by vertical/side conduits 825.

Structures 900/950 that have multiple vertical/side conduits 825 encompassing or surrounding the chip 100/200, provide more connection access to the chip 100/200 and a stronger module 100/200.

Figure 10:
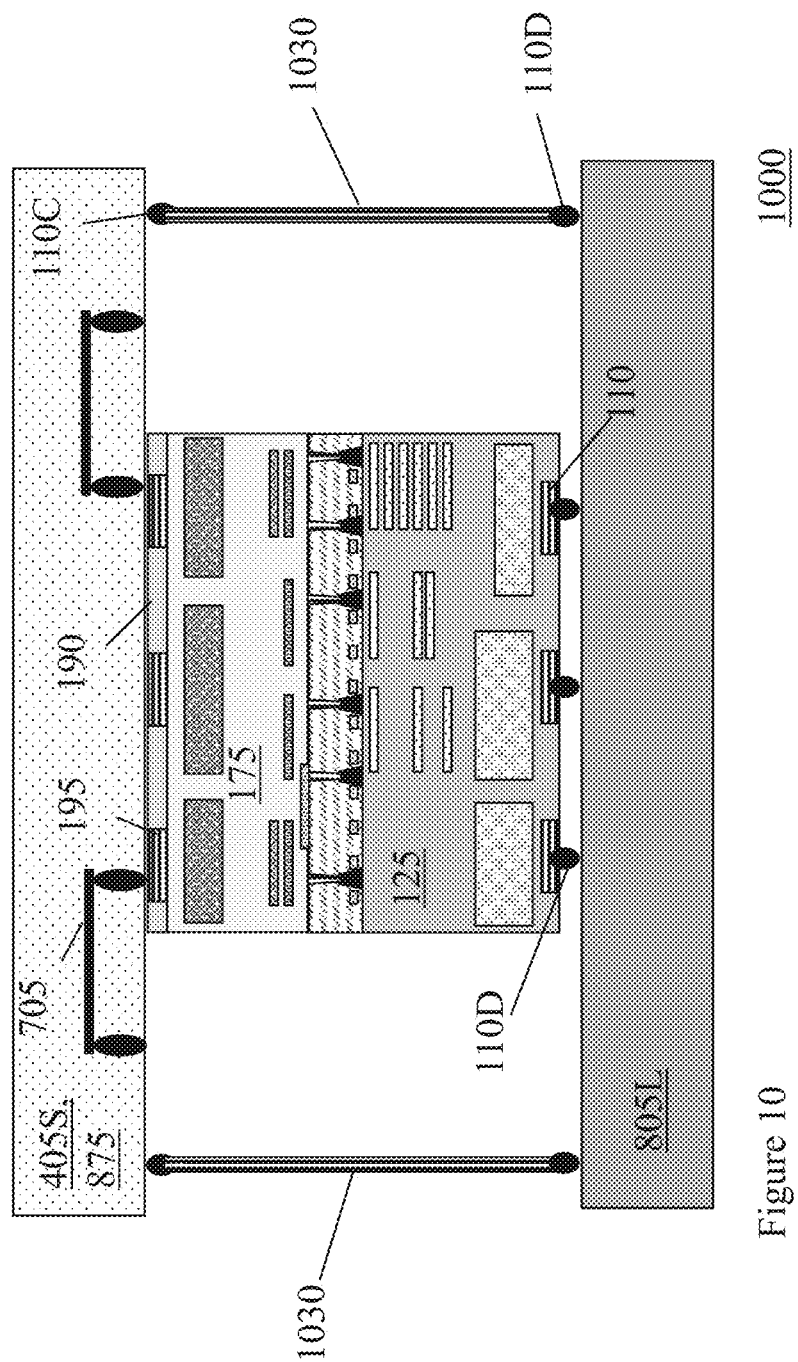
FIG. 10 is a cross section elevation view of a chip module with one or more vertical/side external power distribution conduits that are metal conductors.

FIG. 10 is a cross section elevation view of a chip module 1000 with one or more vertical/side external power distribution conduits 1030 that are metal conductors 1030.

As described above, this embodiment 1000 has one or more top power distribution conduit(s) 875 with one or more top conduit internal connections 705 and one or more top conduit external connections 807. These connections 705/807 to enable greater access, routing, and distribution of connections to the grind side power/ground distribution network 175.

However, in this embodiment 1000, while power, grounding, and other connections are made between the front side power/ground distribution network 125 and the grind side power/ground distribution network 175 through vertical/side conduit connections 1030, the volume of these vertical connections is greatly reduced. In some embodiments, there is little or not material making up the vertical/side conduits 825 other than the vertical/side conduit connections 1030. This embodiment enables a lighter structure 1000 and permits more fluid flow around the module 1000 to cool the chip 100/200.

This embodiment of the vertical/side conduit connections 1030 can be formed by attaching the top power distribution conduit(s) 875 to the chip 100/200 and connecting associated top conduit external connections 807 and assessable substrate power connections 597. These connections can be made by wire bonding.

Figure 11:
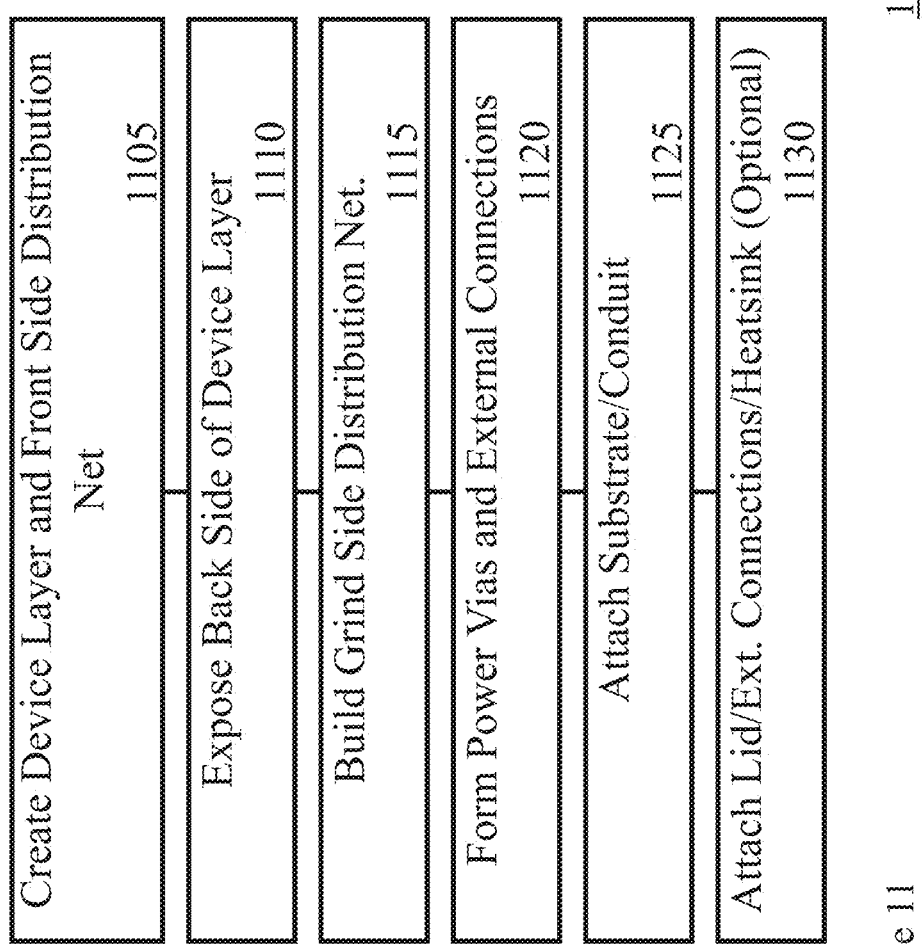
FIG. 11 is a flow chart of a process of making and assembling a chip module.

FIG. 11 is a flow chart of a process 1100 of making and assembling a chip, typically 100, with a dual front side 125 and grind side 175 power/ground distribution network 125/175.

Step 1105 begins the process 1100 by creating the device layer 140, e.g., on a semiconductor substrate 410, e.g., silicon wafer 410, using standard FEOL processes and materials. Then the front side power/ground distribution network 125 is created on the device layer 140 using standard BEOL processes and materials.

In step 1110, layers are removed, e.g., the silicon wafer/substrate 410 and the etch stop layer 415, to expose the back side of the device layer 140.

In step 1115, the grind side power/ground distribution network 175 is built on the back side of the device layer 140.

In step 1120 power through-silicon vias (PTSVs) 292 and other (top) external connections 195/295, e.g., in layers 290 and 250, are formed, if needed. The semiconductor input power layer 250 containing power through-silicon vias (PTSVs) 292 and pads 296 and layer 190A may not be used, as shown in some embodiments above.

In step 1125 the chip (s), e.g., 100, is attached to the substrate 405 and any required vertical/side conduits 825 and/or top power distribution conduit(s) 875 are installed to make a chip module 800/850/1000.

In step 1130, the lid 390 and heatsink 350 are attached, as needed. Typically, if the structure, e.g., 100, is flipped and attached to a second substrate like 805L, the lid 390 and heatsink 350 are not attached.

Note that some of these steps can be performed in a different order or not at all. For example, in some embodiments, structure 300 might be formed by attaching the lid 390 before the structure 300 is attached to the substrate 405. In some embodiments, step 1120, 1125, and/or 1130 may be omitted. In alternative embodiments, structures can be made (and sold as products) without a heat sink 350 and in some instances without a lid 390. See structures 100/200. Also, refer to the modules described in FIGS. 8A, 8B, 9A, and 10, where the substrate/conduit bridge 405S/875 is attached to structure 100 without a lid 390 or heat sink. As stated, in alternative embodiments, the heatsink 350 and sometimes the lid 390 will be attached to the top surface 405S.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A semiconductor chip (chip) comprising:
one or more bottom external connections, one or more of the bottom external connections being a bottom external power connection and one or more of the bottom external connections being a bottom external ground connection;
a front side power network layer, the front side power network layer having one or more front side layers, one of the front side layers being a top front side, one or more of the front side layers having one or more front side power connections and one or more front side ground connections, one or more of the front side power connections electrically connected to one or more bottom external power connections and one or more of the front side ground connections connected to one or more of the bottom external ground connections;
at least one device layer, the device layer having a plurality of devices, one or more of the devices having one or more device power connections and one or more device ground connections, the device layer having a device layer front side and a device layer back grind side, the device layer front side being above and attached to the top front side layer, and one or more of the front side power connections electrically connected to one or more of the device power connections and one or more of the front side ground connections connected to one or more of the device ground connections;
a grind side power network layer, the grind side power network layer having one or more grind side layers, one of the grind side layers being a bottom grind side layer, the bottom grind side layer attached to and above the back grind side of the device layer, one or more of the grind side layers having one or more grind side power connections and one or more of the grind side layers having one or more grind side ground connections, one or more of the grind side power connections electrically connected to one or more of the device power connections and one or more of the grind side ground connections electrically connected to one or more of the device ground connections; and
one or more top external connections, one or more of the top external connections being a top external power connection and one or more of the top external connections being a top external ground connection, one or more of the top external power connections being connected to one or more of the grind side power connections and one or more of the top external ground connections being connected to one or more of the grind side ground connections,
wherein one or more first device power connections is connected to one of the bottom external power connections, one or more second device power connections is connected to one of the top external power connections, and one or more of the device around connections is connected to one of the bottom external ground connections and one of the top external ground connections.

2. The chip, as in claim 1, where the front side power network layer contains a plurality of front side signal connections, one or more of the signal connections connecting to a device signal connection on one or more of the devices.

3. The chip, as in claim 1, where the grind side power network layer contains a plurality of grind signal connections, one or more of the grind signal connections connecting to a device signal connection on one or more of the devices.

4. The chip, as in claim 1, further comprising one or more through power vias, each of the through power vias having a top power via end and a bottom power via end wherein one or more of the through power via bottom power via ends electrically connects to one or more of the front side power connections and one or more of the through power via top power via ends electrically connects to one or more of the one or more grind side power connections, respectively, so that one or more of the front side power connections and one or more of the grind side power connections are electrically connected.

5. The chip, as in claim 1, where the bottom external connections are one or more of the following: a C4 and a conductive pad.

6. The chip, as in claim 1, where the top external connections are one or more of the following: a C4, a conductive pad, and a conductive pad electrically insulated in an insulating layer.

7. A chip module comprising:
a substrate, the substrate having one or more substrate connections, one or more of the substrate connections being a substrate power connection;
a semiconductor chip (chip) comprising:
one or more bottom external connections, one or more of the bottom external connections being a bottom external power connection and one or more of the bottom external connections being a bottom external ground connection;
a front side power network layer, the front side power network layer having one or more front side layers, one of the front layers being a top front side layer, one or more of the front side layers having one or more front side power connections and one or more front side ground connections, one or more of the front side power connections electrically connected to one or more bottom external power connections and one or more of the front side ground connections connected to one or more of the bottom external ground connections;
at least one device layer, the device layer having a plurality of devices, one or more of the devices having one or more device power connections and one or more device ground connections, the device layer having a device layer front side and a device layer back grind side, the device layer front side being above and attached to the front side top layer, and one or more of the front side power connections electrically connected to one or more of the device power connections and one or more of the front side ground connections connected to one or more of the device ground connections;

a grind side power network layer, the grind side power network layer having one or more grind side layers, one of the grind side layers being a bottom grind side layer, the bottom grind side layer attached to and above the back grind side of the device layer, one or more of the grind side layers being one or more grind side power connections and one or more of the grind side layers being one or more grind side ground connections, one or more of the grind side power connections electrically connected to one or more of the device power connections and one or more of the grind side ground connections electrically connected to one or more of the device ground connections; and one or more top external connections, one or more of the top external connections being a top external power connection and one or more of the top external connections being a top external ground connection, one or more of the top external power connections being connected to one or more of the grind side power connections and one or more of the top external ground connections being connected to one or more of the grind side ground connections, wherein one or more first device power connections is connected to one of the bottom external power connections, one or more second device power connections is connected to one of the top external power connections, and one or more of the device ground connections is connected to one or more of the bottom external ground connections and one or more of the top external ground connections, and one or more bottom external power connections is connected to one or more of the substrate power connections.

8. The module, as in claim 7, where the substrate further comprises one or more substrate ground connections and one or more substrate signal connections.

9. The module, as in claim 7, where one or more of the substrate power connections is connected to one or more of the top external power connections.

10. The module, as in claim 9, where one or more of the substrate power connections is connected to one or more of the top external connections by a wire bond.

11. The module, as in claim 9, where one or more of the substrate power connections is connected to one or more of the top external connections by one or more external power distribution conduits.

12. The module, as in claim 11, where one or more of the external power distribution conduits is a side, electrically conductive, vertical column.

13. The module, as in claim 12, further comprising a top external power distribution conduit containing one or more top conduit internal connections, one or more of the top conduit internal connections connects to one or more of the top external power connections and one or more of the vertical columns.

14. The module, as in claim 12, where the side, electrically conductive vertical column is one or more of the following: a metal post, a copper post, and a semiconductor post containing one or more external power through-silicon vias (external power TSVs).

15. The module, as in claim 12, where one or more of the side, electrically conductive vertical columns encompasses three or more sides of the chip.

16. The module, as in claim 7, where the substrate is made of one of the following: a laminate, a semiconductor, a laminate with multiple layers, a resin, and a plastic.

17. A semiconductor chip (chip) comprising:

one or more bottom external connections, one or more of the bottom external connections being a bottom external power connection and one or more of the bottom external connections being a bottom external ground connection;

a front side power network layer, the front side power network layer having one or more front side layers, one of the front side layers being a top front side, one or more of the front side layers having one or more front side power connections and one or more front side ground connections, one or more of the front side power connections electrically connected to one or more bottom external power connections and one or more of the front side ground connections connected to one or more of the bottom external ground connections;

at least one device layer, the device layer having a plurality of devices, one or more of the devices having one or more device power connections and one or more device ground connections, the device layer having a device layer front side and a device layer back grind side, the device layer front side being attached to the top front side, and one or more of the front side power connections on the top front side electrically connected to one or more of the device power connections and one or more of the front side ground connections on the top front side connected to one or more of the device ground connections;

a grind side power network layer, the grind side power network layer having one or more grind side layers, one of the grind side layers being a bottom grind side layer, the bottom grind side layer attached to the back grind side of the device layer, one or more of the grind side layers having one or more grind side power connections and one or more of the grind side layers having one or more grind side ground connections, one or more of the grind side power connections on the bottom grind side layer electrically connected to one or more of the device power connections and one or more of the grind side ground connections on the bottom grind side layer electrically connected to one or more of the device ground connections; and one or more top external connections, one or more of the top external connections being a top external power connection and one or more of the top external connections being a top external ground connection, one or more of the top external power connections being connected to one or more of the grind side power connections and one or more of the top external ground connections being connected to one or more of the grind side ground connections, wherein one or more first device power connections is electrically connected to one of the bottom external power connections, one or more second device power connections is electrically connected to one of the top external power connections, and one or more first device ground connections is electrically connected to one of the bottom external ground connections and one or more second device ground connections is electrically connected to one of the top external ground connections, wherein at least one of the bottom external power connections is electrically connected by a power conduction path to one or more of the top external power connections and through the top external power connections to at least one of the device power connections, wherein at least one of the bottom external ground connections is electrically connected by a ground conduction path to one or more of the top external ground connections and through the top external ground connection to at least one of the device ground connections, and wherein the device layer has a dual power/ground distribution from both the device layer front side and the device layer back grind side.

18. The chip, as in claim 17, further comprising:

one or more of the bottom external connections being a bottom external signal connection;

one or more of the front side layers having one or more front side signal connections, one or more of the front side signal connections electrically connected to one or more of the bottom external signal connections;

one or more of the devices having one or more device signal connections, and one or more of the front side signal connections on the top front side electrically connected to one or more of the device signal connections;

one or more of the grind side layers having one or more grind side signal connections, one or more of the grind side signal connections on the bottom grind side layer electrically connected to one or more of the device signal connections; and one or more of the top external connections being a top external signal connection, one or more of the top external signal connections being connected to one or more of the grind side signal connections, wherein one or more first device signal connections is connected to one of the bottom external signal connections, one or more second device signal connections is connected to one of the top external signal connections.

19. The chip, as in claim 18, where the grind side signal connections provide one or more of the devices in the device layer with one or more of the following: signals, information, data, and control signals.

20. The chip, as in claim 17, where one or more of one or more device power connections is a buried power rail.

* * * * *